:::
United States Patent [19]

Hemmenway et al.

[11] Patent Number: 5,580,816

[45] Date of Patent: Dec. 3, 1996

[54] LOCAL OXIDATION PROCESS FOR HIGH FIELD THRESHOLD APPLICATIONS

[75] Inventors: Donald F. Hemmenway, Melbourne; Lawrence G. Pearce, Palm Bay, both of Fla.

[73] Assignee: Harris Corporation, Melbourne, Fla.

[21] Appl. No.: 481,116

[22] Filed: Jun. 7, 1995

[51] Int. Cl.$^6$ .................................................. H01L 21/76
[52] U.S. Cl. .................................. 437/70; 437/69; 437/72; 437/73; 437/247
[58] Field of Search .................................. 437/69, 70, 72, 437/73

[56] References Cited

U.S. PATENT DOCUMENTS

| | | | |
|---|---|---|---|
| 4,472,873 | 9/1984 | Ko | 437/63 |
| 5,110,756 | 5/1992 | Gregor et al. | 437/70 |

OTHER PUBLICATIONS

Excerpts from Silicon Processing for the VLSI Era by Wolf, et al.

Linn, et al "The Growth of Oxidation Stacking Faults and the Point Defect Generation at Si–SiO Interface during Thermal Oxidation of Silicon" from J. Electrochem Soc.: Solid–State Science and Technology, May 1981. Pp. 1121–1130.

Primary Examiner—Trung Dang
Attorney, Agent, or Firm—Ferdinand M. Romano

[57] ABSTRACT

A method for electrically isolating semiconductor devices in an integrated circuit structure with high field threshold, low defect level regions. The semiconductor structure includes a device layer predominantly comprising lattice silicon with a surface suitable for device formation. Multiple device regions are defined and field regions are defined for electrically isolating the device regions from one another. Dopant species are implanted to create a channel stop adjacent two of the device regions. The implant is of sufficient energy and concentration to impart within the device layer nucleation sites of the type known to result in stacking faults during oxide growth conditions. A thickness of thermally grown silicon dioxide is formed in the field regions by first thermally processing the integrated circuit structure to remove nucleation sites from the device layer and form a minor portion of the field oxide thickness. Subsequently a major portion of the oxide thickness is formed under relatively fast growth conditions.

6 Claims, 5 Drawing Sheets

:::

LOCAL OXIDATION PROCESS FOR HIGH FIELD THRESHOLD APPLICATIONS

FIELD OF THE INVENTION

The present invention relates to provision of electrical isolation between semiconductor devices on an integrated circuit structure and, more particularly, to a manufacturing process which reduces the number of defects resulting from the growth of isolation oxide after ion implantation.

BACKGROUND AND SUMMARY OF THE INVENTION

Many semiconductor processes for fabricating integrated circuit structures involve formation of field or isolation oxide, i.e., by Local Oxidation Of Silicon (LOCOS), along the semiconductor surface to provide electrical isolation between devices. Generally, the substrate surface is covered with a thin thermal oxide followed by a silicon nitride deposition. The nitride is then patterned to cover areas which are to become active regions, while other regions undergo an oxidation in order to form the field oxide. In addition, further steps may be taken to prevent turn-on of parasitic devices in the semiconductor crystal underlying the field oxide. By way of example, when NMOS devices are formed on a P-type substrate, ion implantation, e.g., with boron, is performed to increase the dopant level under the field oxide thereby, in combination with the thick field oxide, raising the threshold turn-on voltage of any parasitic device which extends under the field oxide. Generally, for MOS parasitics the threshold voltage is kept to a level which prevents fields associated with voltages in the overlying gate layer, source or drain conductors, or other interconnect from rendering the parasitic device conductive.

Numerous problems have been reported in cases where channel stop implants are used in combination with field oxides. See Wolf, *Silicon Processing for the VLSI Era*, Volume 21, Chapter 2 for a general discussion. Specifically, lattice dislocations generated during channel stop implantation are known to result in stacking faults during subsequent thermal processing such as the aforementioned field oxide growth. When these oxidation induced stacking faults (OISFs) extend into the active regions they can cause leakage currents which degrade device performance. In the past this has meant that certain performance specifications could only be met at the expense of others. Thus, in order to design an isolation structure with minimimally sufficient parasitic threshold voltages, it may be necessary to tolerate more leakage current than desired or accept less area efficiency. Several solutions have been identified to minimize such trade-offs. For example, field oxide growth under High Pressure Oxidation can limit dopant diffusion by reducing the oxide growth temperature while sustaining a high rate of oxidation; and a combined germanium-boron implant favorably reduces the born diffusion rate, thereby reducing the loss of boron by diffusion into the oxide and by lateral diffusion. It is also well known that with a chlorine implant the oxidation rate can be increased and the time required for oxide growth shortened. That is, by growing the field oxide faster there is less time for a highly mobile dopant species such as boron to diffuse into the oxide and, overall, a lower implant dose can be used to create the channel stop. Lower implant doses result in less lattice damage.

Notwithstanding the above-described process enhancements, development of stacking faults during the field isolation process continues to require significant trade-offs in order to achieve necessary field threshold voltages to prevent turn-on of parasitic devices. Absent such OISFs, parasitic threshold turn-on voltages could be further improved while also advancing to higher levels of mixed signal integration. It would, for example, become possible to further increase the density of integrated circuits containing power devices, low voltage CMOS logic and high voltage analog transistors.

The OISF problem may be best understood with reference to an example process sequence applicable to a high volume, highly cost sensitive manufacturing environment. The starting material is a wafer of lightly doped p-type monocrystalline silicon. After growth of a thin oxide layer on the wafer surface, active device regions are defined over the semiconductor surface with patterned silicon nitride. It is common to form the channel stop regions in alignment with the nitride pattern before growing the overlying field oxide. In the case of an n-channel field device, a p-type channel stop implant, e.g., boron, is used, while in the case of a p-channel field device, an n-type channel stop implant, e.g., phosphorous, is employed. In order to sustain a minimum 15 volt parasitic field threshold voltage a boron implant dose of at least $1E14/cm^2$ would normally be required. A dose of this magnitude is known to impart lattice damage of the type which seeds OISFs during subsequent LOCOS. Due to the thickness of field oxide which typically must be grown under the cost constraints of volume manufacturing, LOCOS is commonly performed at a relatively high oxide growth rate, e.g., 1 micron thick in 3 hours of oxidation. Rapid growth normally occurs under relatively high thermal conditions with the undesirable diffusion of high mobility dopant species such as boron. OISF growth is known to occur under such rapid oxidation conditions.

There is now provided an improved process for isolating active regions of semiconductor devices with the combination of channel stop implantation and field oxide growth. The process minimizes or eliminates OISF's while permitting high-dose, e.g., $1E14/cm^2$ and higher, channel stop implants. The process is amenable to include techniques for reducing undesirable dopant diffusion, thereby allowing for a higher ratio of achievable parasitic threshold voltage to implant dose.

Generally, the process is a method for electrically isolating semiconductor devices in an integrated circuit structure with high field threshold, low defect level regions. The semiconductor structure includes a device layer predominantly comprising lattice silicon with a surface suitable for device formation. Multiple device regions are defined and field regions are defined for electrically isolating the device regions from one another. Dopant species are implanted to create a channel stop adjacent two of the device regions. The implant is of sufficient energy and concentration to impart within the device layer nucleation sites of the type known to result in stacking faults during oxide growth conditions. A thickness of thermally grown silicon dioxide is formed in the field regions by first thermally processing the integrated circuit structure to remove nucleation sites from the device layer and form a minor portion of the field oxide thickness; and subsequently forming a major portion of the oxide thickness under relatively fast growth conditions.

DETAILED DESCRIPTION OF THE INVENTION

According to the invention it is now recognized that satisfactory net oxide growth rates suitable for a high volume, cost sensitive, manufacturing environment, can be sustained while process conditions are sequentially altered to inhibit OISF's. This is to be distinguished from shrinkage of stacking faults, which has been observed at high temperature, long oxidation conditions. (See Lin, et al., *J. Electrochem. Soc.: Solid-State Science And Technology*, May 1981.) That is, a sequence of process steps is provided which (1) assures relatively short oxidation cycles suitable for the manufacturing environment, (2) provides acceptable levels of dopant outdiffusion, and (3) inhibits OISF development in the first instance.

Figure 1A:
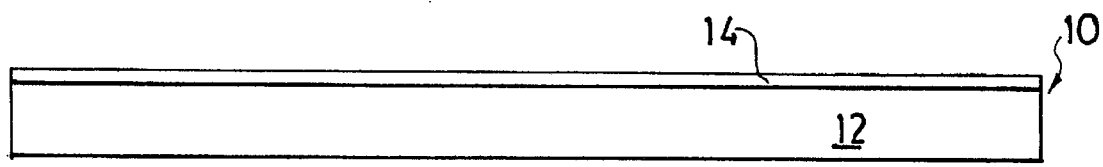
FIGS. 1(*a–m*) illustrate an integrated circuit manufacturing process incorporating the invention.

With reference to FIG. 1a, there is shown a starting wafer 10 having a lightly doped (8–12 ohm-cm) p-type silicon substrate 12 with a thin masking layer 14 of thermally grown silicon dioxide formed thereon. Prior to device formation implants are made to form complementary, low resistivity, conductive buried layers. An epitaxial layer is then grown over the substrate 12. This is more fully described below with reference to FIGS. 1b through 1d.

Figure 1B:
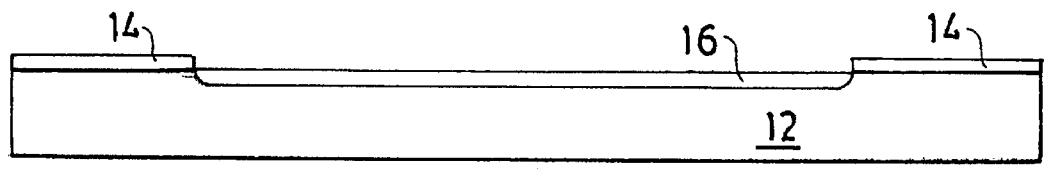
Figure 1C:
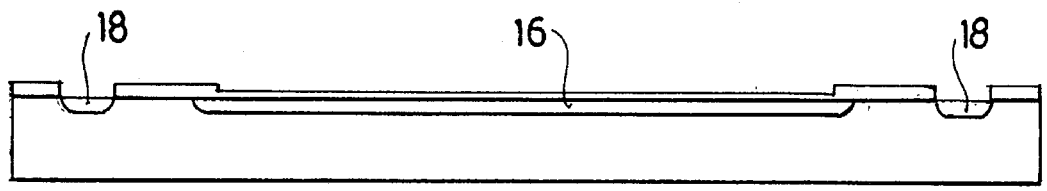
Figure 1D:
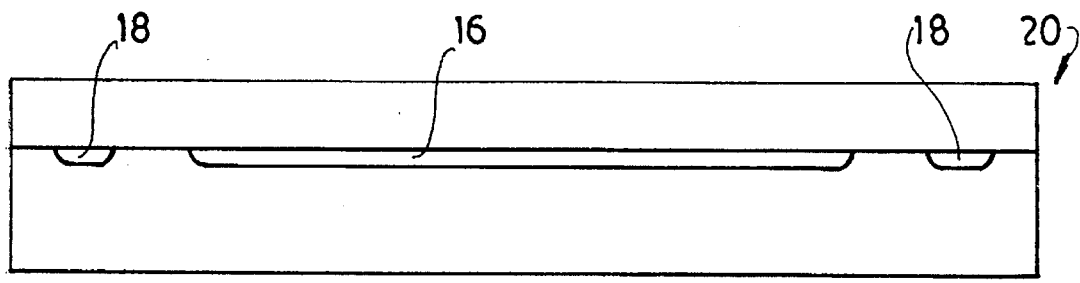

The oxide layer 14 is patterned with photoresist and openings are sequentially made for the substrate to receive an n-type implant (which establishes n-type buried layer 16), FIG. 1b, and a p-type implant (which establishes p-type buried layer 18), FIG. 1c. The implant for the n-type buried layer 16 could be arsenic, 40 KeV, 1.25E16/cm2; and the implant for the p-type buried layer 18 could be boron, 30 KeV, 1.3E15/cm2. The oxide layer 14 is then stripped and a 10 micron (1.0 ohm-cm) n-type device layer 20 is epitaxially grown over the substrate 12. The resulting structure is shown in FIG. 1d.

Figure 1E:
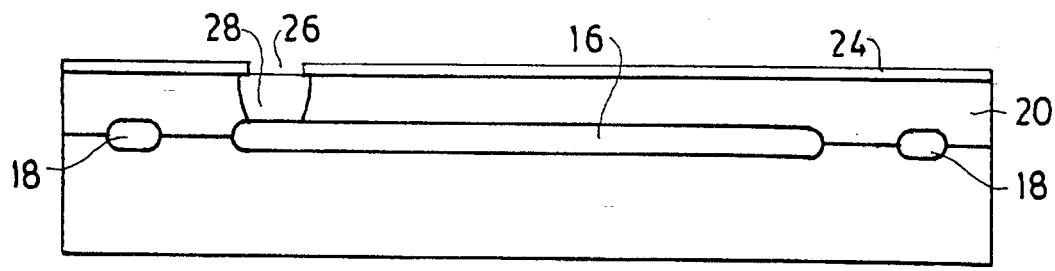

Next a contact is made through the layer 20 to the n-type buried layer by growing a thick oxide (6500 Angstroms) layer 24, patterning an opening 26 over the buffed layer 16 (photoresist followed by HF etch) and doping the portion of the device layer 20 exposed through the opening 26, e.g., by outgasing phosphorous from a solid wafer source. The wafer is heated to drive the phosphorous down to meet the buried layer 16, thereby creating a low resistivity, e.g., 3 ohm/sq, contact 28. See FIG. 1e.

Figure 1F:
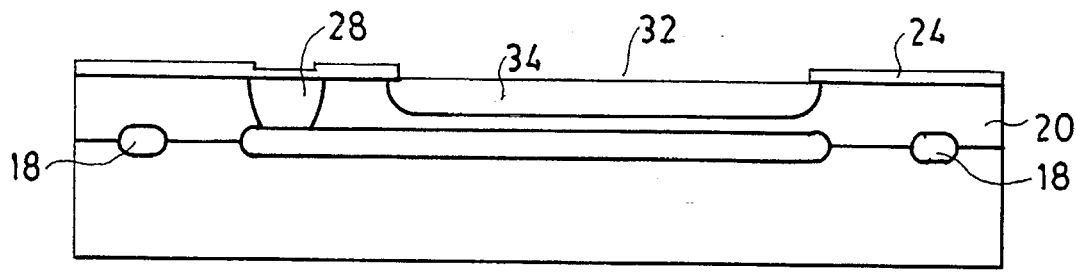

Note that the buried layers 16 and 18 diffuse into the device layer 20 during the drive in. As illustrated in FIG. 1f the diffusion step results in regrowth of oxide over the contact 28.

Figure 1G:
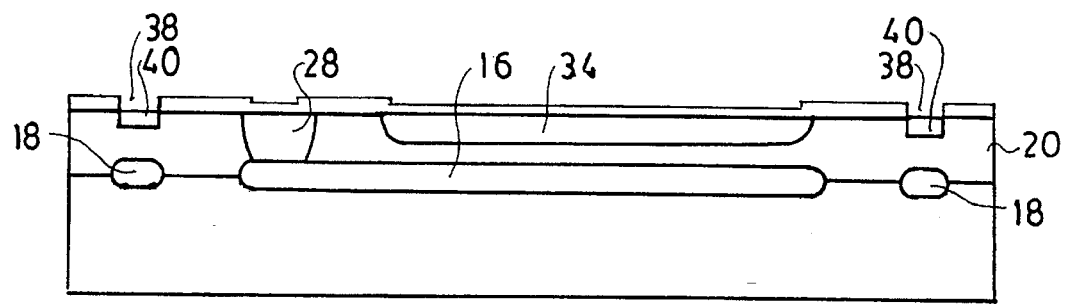
Figure 1H:
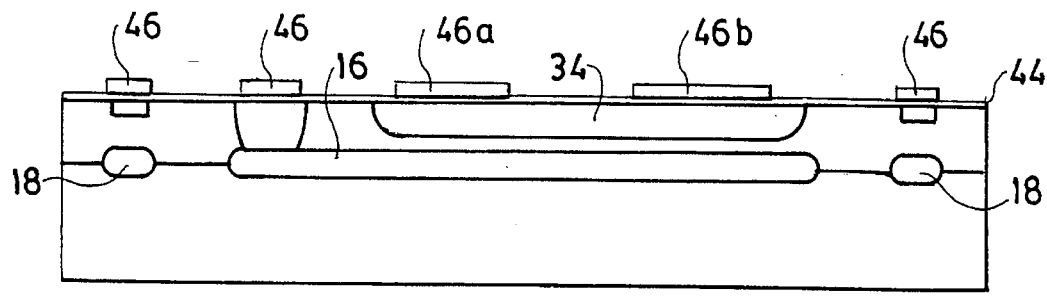

With photoresist patterning followed again by an HF etch, an opening 32 is next made to perform a boron implant (100 KeV, 8.5E12/cm2) followed by thermal diffusion to create the p-type well 34 of FIG. 1f. During the diffusion step oxide regrowth covers the well 34. Another photoresist pattern and etch step provides opening 38 to receive a deep p+ implant 40 (boron, 50 KeV, 1E16/cm2). See FIG. 1g. The patterned oxide layer 24 is then removed and a new 500 Angstrom oxide layer 44 is grown over the surface. Next a 1200 Angstrom layer 46 of silicon nitride is deposited over the oxide layer 44 and patterned with photoresist to define active areas for device formation. See FIG. 1h. Silicon nitride pattern 46a covers a 5 volt NMOS region and silicon nitride pattern 46b covers a 15 volt NMOS region. Portions of the nitride layer are also patterned to isolate other areas of the device layer 20 such as the contact 28 during subsequent growth of field oxide.

Figure 1I:
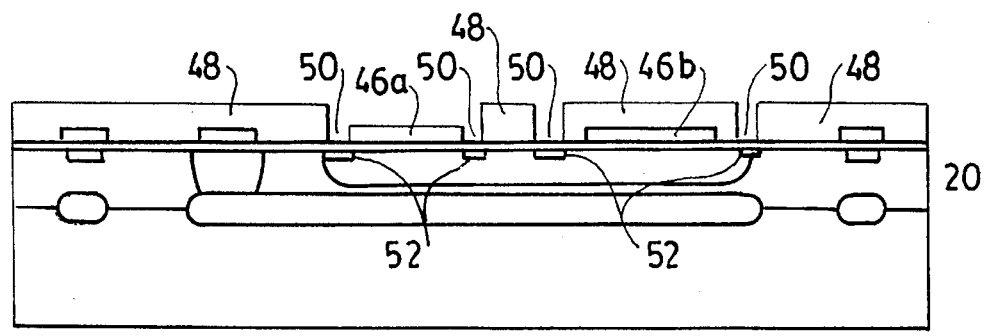

More photoresist 48 is deposited and patterned to define open areas 50 in the oxide layer 44 through which portions of the device layer 20, adjacent the device region patterns 46a and 46b, receive p-type channel stop field implants 52. See FIG. 1i. Note, for the 5 volt device region the boron implant is aligned to the edges of the nitride pattern 46a while, for the 15 volt device region the boron implant location is not aligned to the edges of the nitride pattern 46b. The channel stop implant for the 15 volt device is spaced away from the nitride edges by photoresist in order to achieve a source-drain breakdown voltage in excess of 15 volts. This breakdown voltage is, of course, a function of the specific dopant levels and profiles.

The channel stop field implants 52 are of sufficient energy and concentration, e.g., boron, 26 KeV, 1.4E14/cm2, to impart nucleation sites within the layer 20 of the type known to create stacking faults during oxide growth conditions. Notwithstanding, at this point it would be conventional to remove the photoresist from the structure and proceed with rapid thermal growth of field oxide. Instead, according to the invention the structure 10 is first thermally processed to remove nucleation sites from the device layer and form a minor portion 56 of field oxide, i.e., silicon dioxide, through portions of the oxide layer 44 left exposed after removal of the photoresist 48. See FIG. 1j. Oxide growth is then continued under accelerated conditions consistent with conventional high volume manufacture. The preferred process conditions are as follows.

The wafer structure is placed in a furnace under an inert, e.g., nitrogen, environment, initially at 700 C. and the temperature is gradually elevated to 1050 C. at 10 degrees C. per minute. After this ramp-up the structure 10 is annealed in the nitrogen atmosphere at 1050 C. for 75 minutes. This anneal removes nucleation sites in the device layer 20 and translates the distribution profile of the channel stop implant 52 deeper into the device layer 20.

An advantage of driving the implant into the device layer before field oxide growth relates to nonuniformities in the thickness of the oxide layer 44 through which the channel stop implant is made. The p-type field is implanted through the oxide layer 44 after the nitride layer is patterned and etched. Variability in both the oxide layer 44 growth thickness and the amount of the oxide layer consumed during the nitride etch produces variability in the thickness of the oxide layer 44 present when the p-type field implant is performed.

Figure 2A:
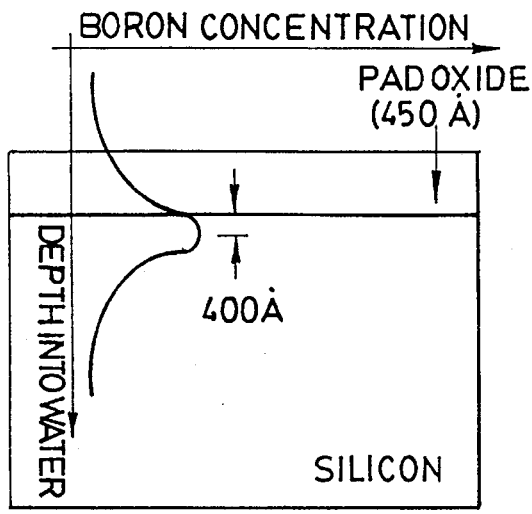
FIGS. 2(*a–d*) provide a comparison of dopant distributions based on implantation through differing thickness of oxide.
Figure 2B:
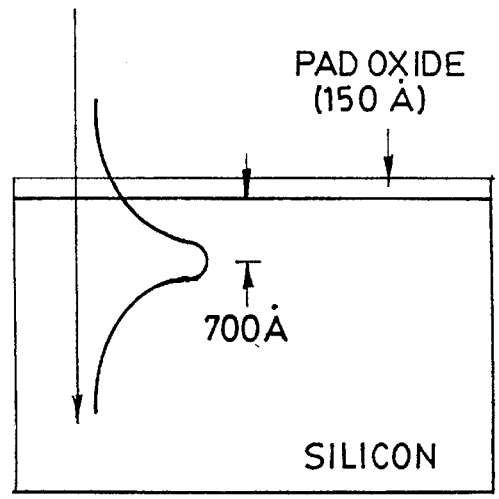

In the case of a thick portion of the pad oxide layer 44 during the implant (FIG. 2a, 450 Angstroms thick), the peak of the implant is roughly 400 Angstroms below the silicon surface, whereas for a thin portion of the pad oxide 44 (FIG. 2b, 150 Angstroms), the peak resides about 700 Angstroms below the surface. During the field oxide growth, boron near the silicon surface will segregate into the growing oxide layer, producing a net loss of dopant in the p-type field layer. Therefore, with a conventional LOCOS recipe, the amount of boron lost during oxidation will be very sensitive to the thickness of oxide layer 44 during the field implant due to the significant difference in the depth of the doping peak.

Figure 2C:
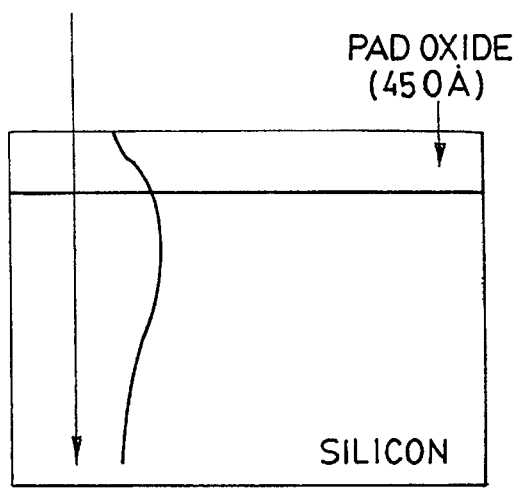
Figure 2D:
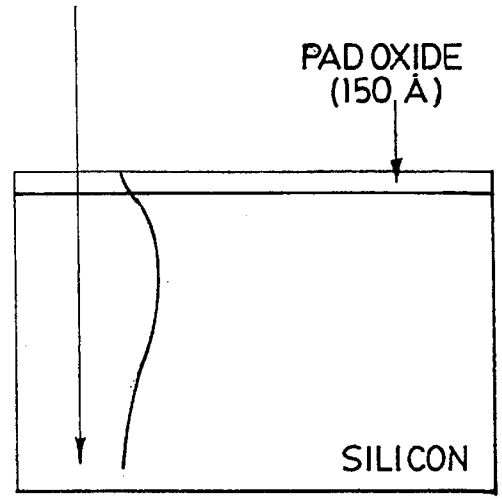

In contrast, using the improved process described herein, the anneal step before oxidation will drive the boron deeper into the silicon, therefore both minimizing the amount of boron lost during oxidation and reducing sensitivity to oxide thickness during implantation. FIGS. 2c and 2d show the boron distributions of FIGS. 2a and 2b, respectively, after the anneal step. The boron concentration near the silicon surface has been reduced and is seen to be more equivalent for the two pad oxide thicknesses. Data indicates that sensitivity of final p-field layer sheet resistance to oxide thickness is reduced ten fold.

The atmosphere is then modified to begin growth of field oxide under high temperature, low oxidation rate conditions. For example, start at 6 percent oxygen, 94 percent nitrogen for approximately 30 minutes, followed by 30 percent oxygen, 70 percent nitrogen for about 15 minutes. To the extent not all of the nucleation sites have been removed during the preceeding anneal step, application of high temperature, low growth rate conditions during initial stages of field oxide growth will minimize creation of OISFs. Variants of these conditions, such as a single, but longer, growth at 10 to 20 percent oxygen content may also provide satisfactory results.

Figure 1J:
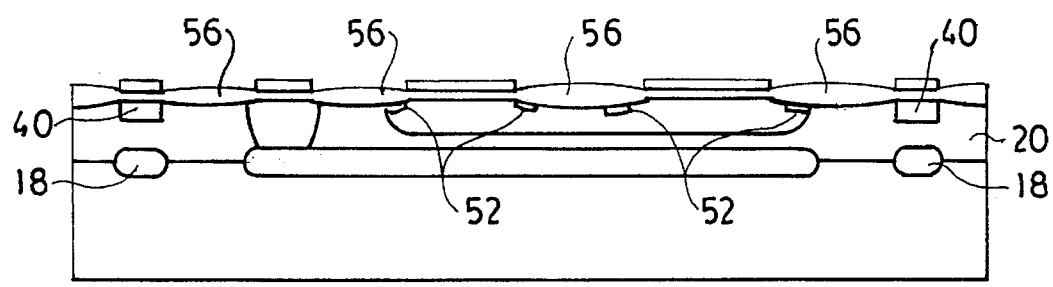

An important feature of the invention runs counter to conventional practice of growing field oxide under conditions which result in undesirable diffusion of dopant species combined with a high oxidation rate. Instead, initial growth of field oxide occurs under high temperature, slow oxidation rate conditions to minimize development of OISF's. Further, according to the invention, accompanying concerns relating to loss of dopant species by high temperature diffusion during the slow oxidation process are mitigated by the aforementioned anneal which drives the dopant distribution away from the oxide 44 and deeper into the device layer. The structure 10 with growth of the minor portion 56 of field oxide, e.g., 200 Angstroms or more, is shown in FIG. 1j. It is characterized by a highly efficient channel stop implant and a low defect density in portions of the device layer 20 beneath the field oxide.

Figure 1K:
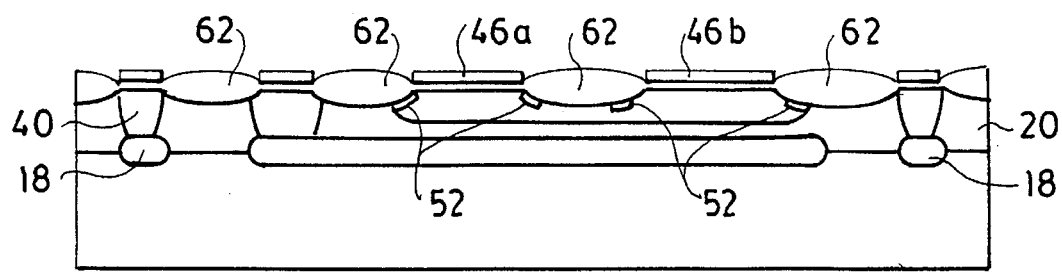

The structure 10 is next subjected to a higher oxidation rate to complete the field oxide growth. The majority of field oxide growth proceeds under high temperature conditions, e.g., 1050 C., for 180 minutes in steam. The temperature is then gradually decreased (3 degrees C. per minute) to 700 C. and at that point the wafer structure having field oxide formations 62, commonly one micron thick, is pulled from the furnace. See FIG. 1k. Experimental data indicates that performing the rapid field oxide growth after growth under the high temperature, slow oxidation rate conditions does not adversely affect the defect density of the device layer. Specifically, the density of OISFs under the field oxide formations 62, in the region of p-type channel stop implants, has been measured as low as 5 per cm2 through the device layer 20. This is to be compared to OISF densities observed in conventionally processed field oxides exceeding 1E6/cm2.

Figure 1L:
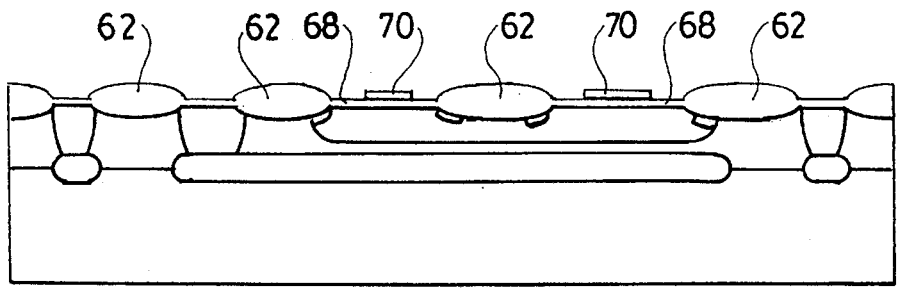
Figure 1M:
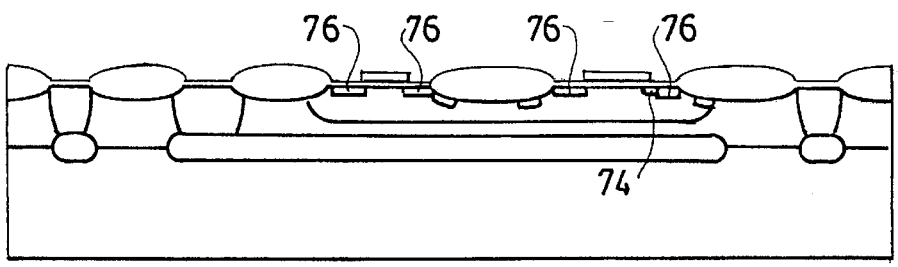

Once field oxide growth is complete processing continues in a well known manner. That is, the nitride layer 46 and the pad oxide layer 44 are stripped from the surface and a high quality gate oxide 68 is thermally grown between the field oxide formations 62. Polysilicon is deposited and patterned into gates 70. See FIG. 1l. With further masking and implanting a lightly doped drain region 74 for the 15 volt NMOS device, as well as self-aligned source and drain regions 76 for both the 5 volt and 15 volt NMOS devices are formed. See FIG. 1m.

Figure 3:
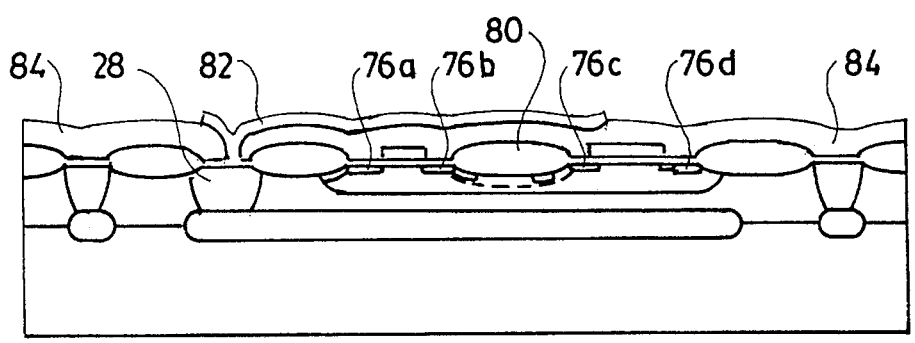
FIG. 3 illustrates in cross section 5 volt and 15 volt NMOS devices having improved performance capability according to the invention.

A feature of the invention, higher threshold parasitic turn-on voltages in the field oxide regions, enables more compact routing of gate level interconnect and metal routing such as contacts to the MOS source and drain diffusions, body ties, etc. For example, FIG. 3 illustrates in cross section the 5 volt and 15 volt NMOS devices of FIGS. 1 to further illustrate achievable metal routing when the channel stop implants border the active device region of the 5 volt NMOS transistor. A parasitic NMOS device is formed under field oxide region 80 with source and drain regions 76b and 76c. Metal line 82 to contact 28 forms the gate of the parasitic device. Interlevel oxide layer 84 and field oxide region 80 form the gate dielectric. The parasitic NMOS would electrically link the N+ regions 76b and 76c of the 5 volt and 15 volt devices if the field generated by the voltage in the overlying gate 82 exceeds the parasitic turn-on voltage. With the high efficiency implants forming channel stops 52 the NMOS devices operate without turning on the parasitic device. In addition to this example, the benefits derived from the present process include improved immunity to turn-on of a variety of other parasitic devices and more flexible interconnect schemes having higher immunity and improved layout efficiencies.

A process has been described which inhibits OISFs and yet provides net oxide growth rates suitable for a high volume, cost sensitive, manufacturing environment. Numerous variations of the invention apart from the disclosed embodiments will be apparent. For example, the aforedescribed anneal to be performed in the nitrogen atmosphere at 1050 C. for 75 minutes need not occur in an inert environment. The anneal could also be performed in an oxidizing ambient that shrinks OISFs, such as a high temperature, low oxidation rate environment. Further, although the invention has been described in the context of creating a low defect density region about a channel stop, the associated implant could be used to create other structures including a conductive region under field oxide. Accordingly, the invention is only to be limited in scope by the appended claims.

While the (method) herein described, and the form(s) of apparatus for carrying this (these) method(s) into effect, constitute preferred embodiments of this invention, it is to be understood that the invention is not limited to this (these) precise method(s) and form(s) of apparatus, and that changes may be made in either without departing from the scope of the invention, which is defined in the appended claims.

That which is claimed:

1. A method for electrically isolating semiconductor devices in an integrated circuit structure with high field threshold, low defect level regions, comprising the steps of:

providing a semiconductor structure having a device layer predominantly comprising lattice silicon with a surface suitable for device formation therein;

forming one or more patterned layers over the silicon surface to define multiple device regions and field regions for electrically isolating the device regions from one another;

providing an implant of a dopant species in a defined field region adjacent two of the device regions, said implant of sufficient energy and concentration to impart nucleation sites within the device layer of the type known to result in stacking faults during oxide growth conditions;

providing a thickness of thermally grown silicon dioxide in the field regions by thermally processing the structure to remove nucleation sites from the device layer;

reacting the structure in an oxygen-containing atmosphere predominantly comprising inert constituents to form a minor portion of silicon dioxide thickness; and subsequently forming a major portion of the oxide thickness under relatively fast growth conditions in comparison to formation of said minor portion.

2. The method of claim 1 wherein:

the implant creates a channel stop; and thermally processing the structure comprises the step of annealing the device layer in an inert environment to remove the nucleation sites.

3. The method of claim 2 wherein the step of subsequently forming a major portion of the oxide thickness is performed in a steam environment.

4. The method of claim 2 wherein the anneal is performed at a temperature which drives the distribution of channel stop implant further into the device layer and away from the surface.

5. The method of claim 1 wherein thermally processing the structure includes simultaneously annealing the device layer to remove nucleation sites and said step of reacting the structure in an oxygen-containing environment to begin forming said minor portion of the oxide thickness.

6. The method of claim 2 wherein the step of reacting the structure includes reacting in an atmosphere containing less than ten percent oxygen for at least 15 minutes, followed by reacting in an atmosphere containing between 20 percent and 40 percent oxygen for at least 10 minutes.

* * * * *